United States Patent
Fujita

(10) Patent No.: US 9,747,966 B2
(45) Date of Patent: Aug. 29, 2017

(54) SEMICONDUCTOR MEMORY DEVICE FOR SENSING MEMORY CELL WITH VARIABLE RESISTANCE

(71) Applicant: KABUSHIKI KAISHA TOSHIBA, Minato-ku, Tokyo (JP)

(72) Inventor: Katsuyuki Fujita, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/065,449

(22) Filed: Mar. 9, 2016

(65) Prior Publication Data

US 2017/0062033 A1    Mar. 2, 2017

Related U.S. Application Data

(60) Provisional application No. 62/209,673, filed on Aug. 25, 2015.

(51) Int. Cl.
| | |
|---|---|
| G11C 11/16 | (2006.01) |
| H01L 27/22 | (2006.01) |
| H01L 43/08 | (2006.01) |
| G11C 5/14 | (2006.01) |

(52) U.S. Cl.
CPC ...... *G11C 11/1673* (2013.01); *G11C 11/1697* (2013.01); *H01L 27/226* (2013.01); *H01L 43/08* (2013.01); *G11C 5/146* (2013.01); *G11C 2207/002* (2013.01)

(58) Field of Classification Search
CPC ................................................ G11C 11/1673
USPC ........................................................ 365/158
See application file for complete search history.

(56) References Cited

U.S. PATENT DOCUMENTS

| | | | |
|---|---|---|---|
| 6,177,811 B1 | 1/2001 | Fuse et al. | |
| 6,246,621 B1* | 6/2001 | Miyamoto | G11C 7/14 |
| | | | 365/189.09 |
| 6,674,679 B1* | 1/2004 | Perner | G11C 7/062 |
| | | | 365/189.07 |
| 7,511,992 B2* | 3/2009 | Ueda | G11C 11/16 |
| | | | 365/158 |
| 7,916,515 B2* | 3/2011 | Li | G11C 11/16 |
| | | | 365/148 |
| 9,542,988 B1* | 1/2017 | Inaba | G11C 11/1673 |
| 2001/0009527 A1* | 7/2001 | Tanzawa | G11C 16/28 |
| | | | 365/207 |
| 2004/0062074 A1* | 4/2004 | Ooishi | G11C 11/15 |
| | | | 365/158 |

(Continued)

FOREIGN PATENT DOCUMENTS

KR   WO 2015136740 A1 *  9/2015  ......... G11C 11/1673

*Primary Examiner* — Anthan Tran
*Assistant Examiner* — Mushfique Siddique
(74) *Attorney, Agent, or Firm* — Holtz, Holtz & Volek PC

(57) ABSTRACT

According to one embodiment, a semiconductor memory device includes a memory cell; a reference signal generation circuit; a sense amplifier; a first transistor configured to electrically couple the memory cell and a first input terminal of the sense amplifier; a second transistor configured to electrically couple the reference signal generation circuit and a second input terminal of the sense amplifier; a first control circuit configured to supply a voltage to gates of the first transistor and the second transistor; a second control circuit configured to supply a first voltage except 0V to a back gate of the first transistor; and a third control circuit configured to supply a second voltage except 0V to a back gate of the second transistor.

10 Claims, 10 Drawing Sheets

(56) References Cited

U.S. PATENT DOCUMENTS

| | | | |
|---|---|---|---|
| 2008/0165592 A1* | 7/2008 | Kitagawa | G11C 11/16 365/189.09 |
| 2009/0010045 A1* | 1/2009 | Ueda | G11C 11/15 365/158 |
| 2009/0225586 A1* | 9/2009 | Ueda | G11C 7/062 365/158 |
| 2009/0323396 A1* | 12/2009 | Inaba | G11C 11/1655 365/148 |
| 2010/0054020 A1* | 3/2010 | Ueda | G11C 7/062 365/148 |
| 2010/0073992 A1 | 3/2010 | Ueda | |
| 2010/0321980 A1* | 12/2010 | Fujita | G11C 11/16 365/148 |
| 2011/0176350 A1* | 7/2011 | Jung | G11C 11/1673 365/148 |
| 2011/0199812 A1 | 8/2011 | Kitagawa et al. | |
| 2012/0155146 A1* | 6/2012 | Ueda | G11C 11/1659 365/148 |
| 2012/0243286 A1* | 9/2012 | Inaba | G11C 11/1659 365/66 |
| 2013/0300462 A1* | 11/2013 | Koyama | H03K 17/302 327/109 |
| 2014/0285226 A1* | 9/2014 | Li | G11C 13/0002 324/705 |
| 2014/0286075 A1* | 9/2014 | Katayama | G11C 13/004 365/66 |
| 2014/0286080 A1* | 9/2014 | Takahashi | G11C 13/004 365/148 |
| 2014/0286082 A1* | 9/2014 | Takahashi | G11C 13/004 365/148 |
| 2014/0286088 A1* | 9/2014 | Takahashi | G11C 11/1673 365/158 |
| 2015/0155037 A1* | 6/2015 | Lee | G11C 13/0069 365/148 |
| 2015/0348626 A1* | 12/2015 | Nakayama | H01L 45/04 365/51 |
| 2016/0093350 A1* | 3/2016 | Jung | G11C 11/1673 365/158 |
| 2016/0379699 A1* | 12/2016 | Takahashi | G11C 11/1675 365/158 |
| 2017/0069380 A1* | 3/2017 | Takahashi | G11C 13/004 |
| 2017/0076791 A1* | 3/2017 | Takahashi | G11C 13/0004 |

\* cited by examiner

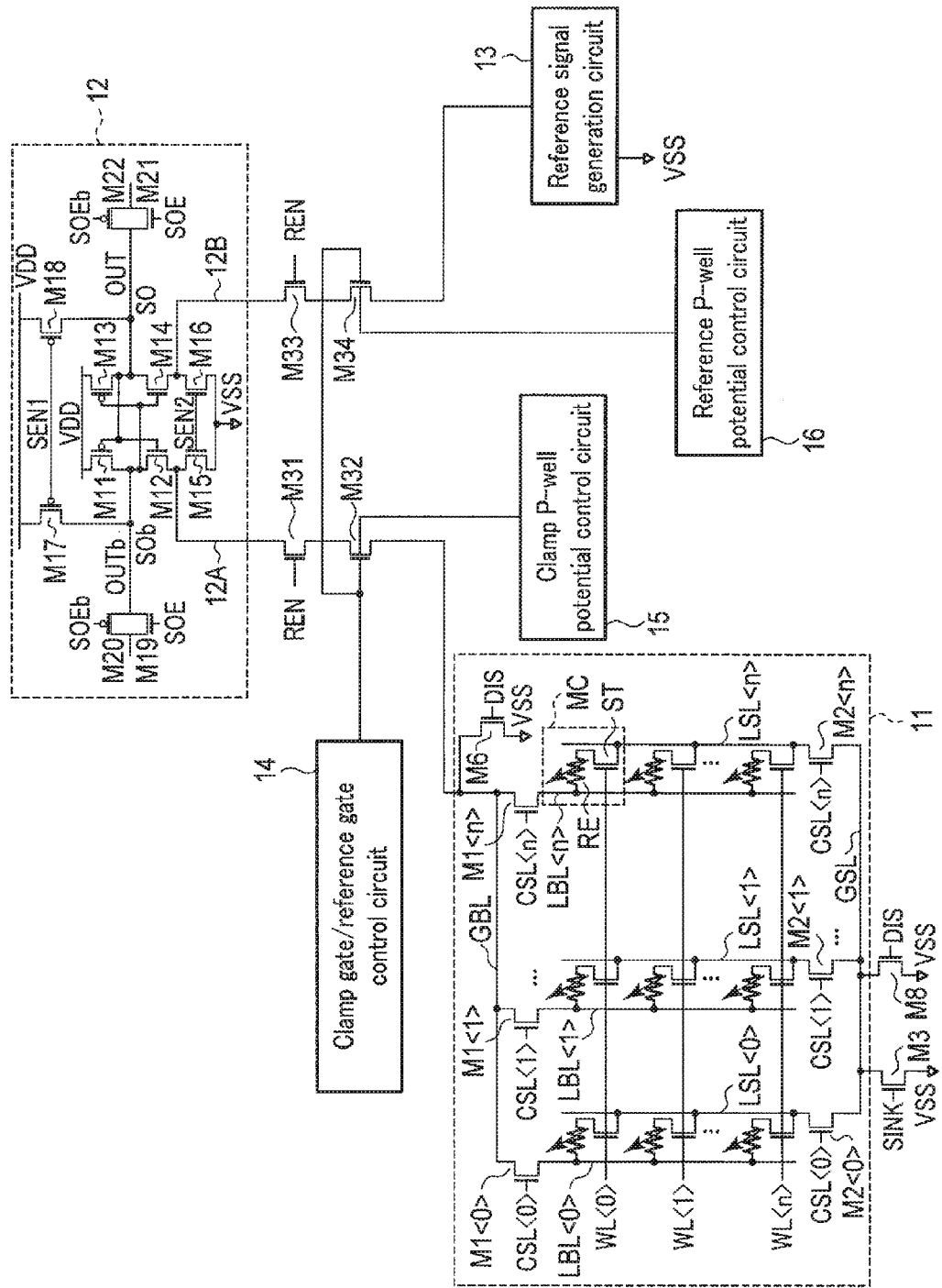
F I G. 1

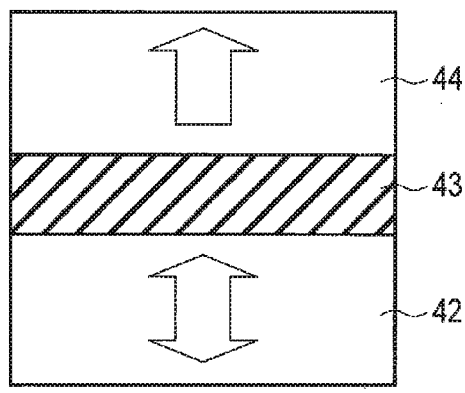
FIG. 2A
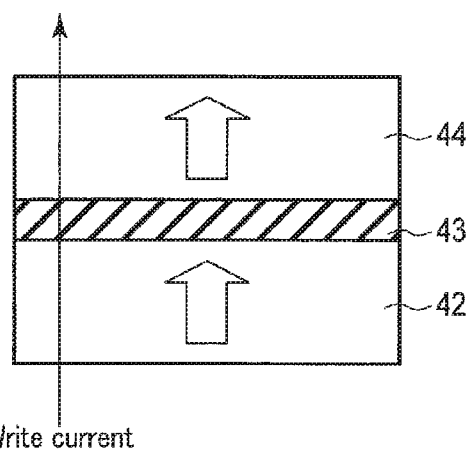
FIG. 2B    Parallel state (low resistance)
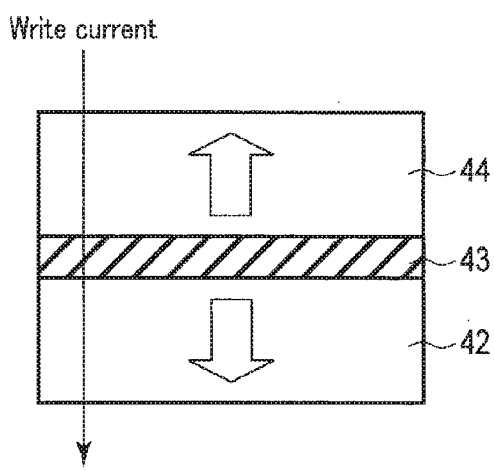
FIG. 2C    Antiparallel state (high resistance)

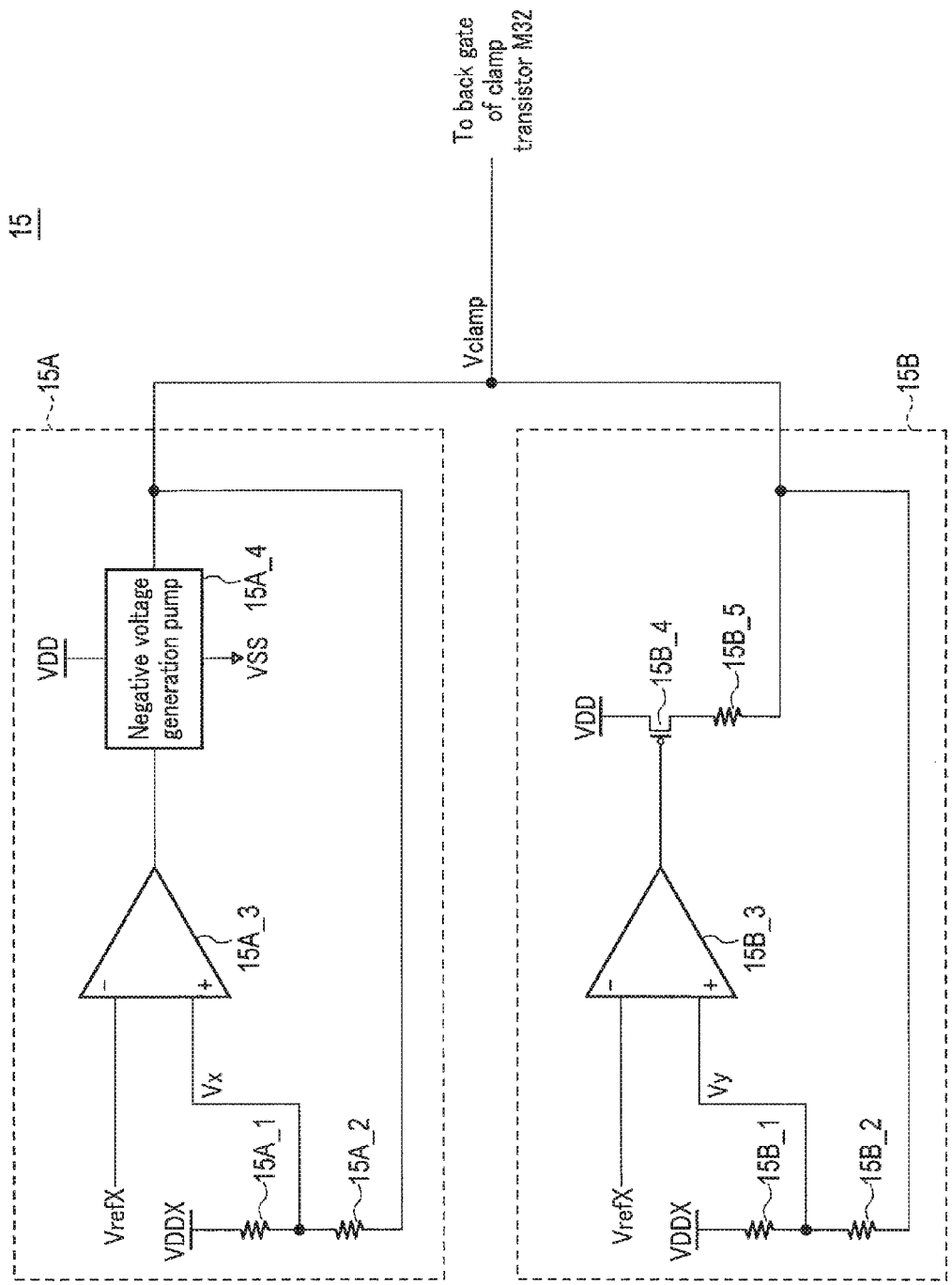
F I G. 3

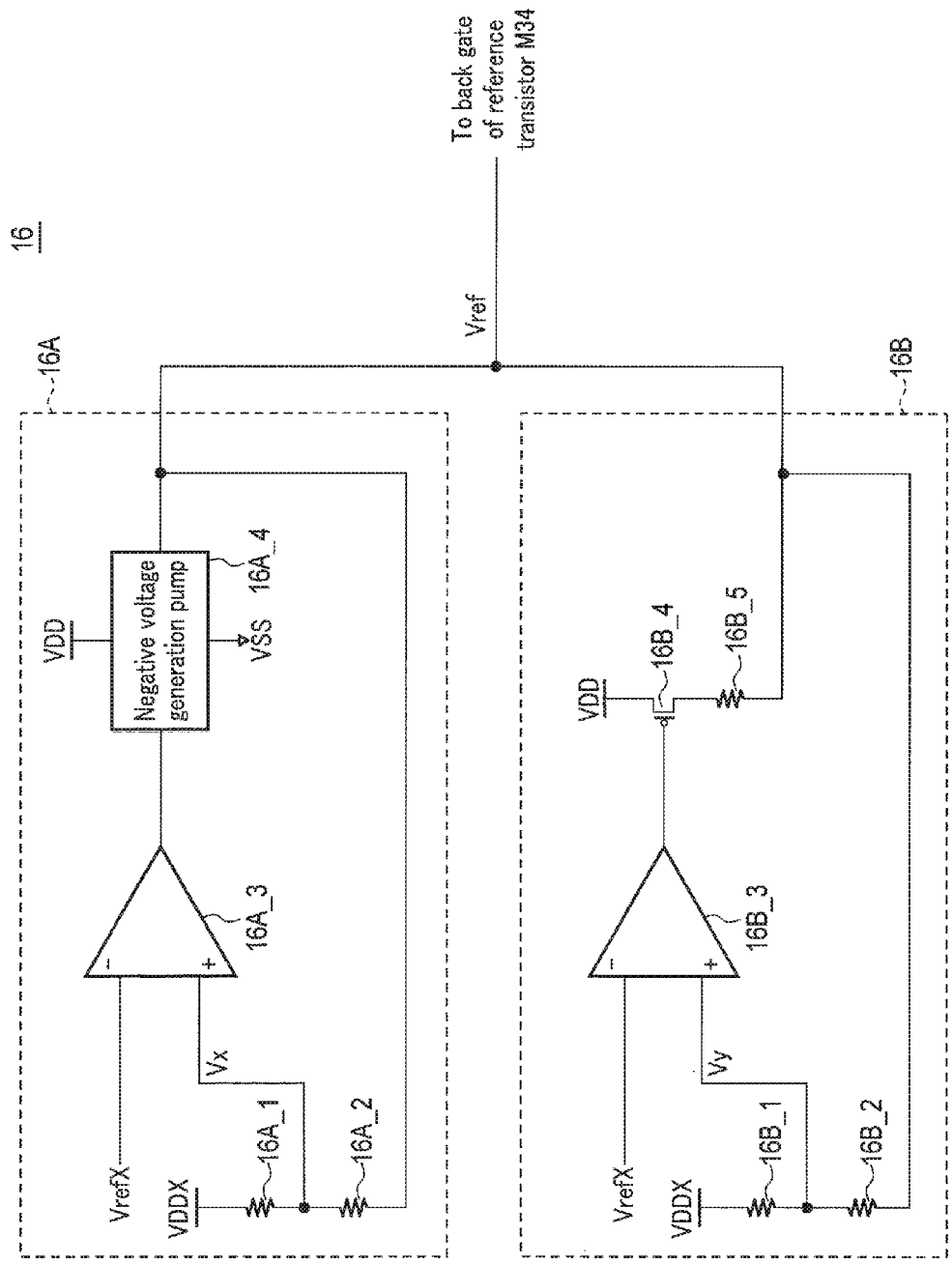
F I G. 4

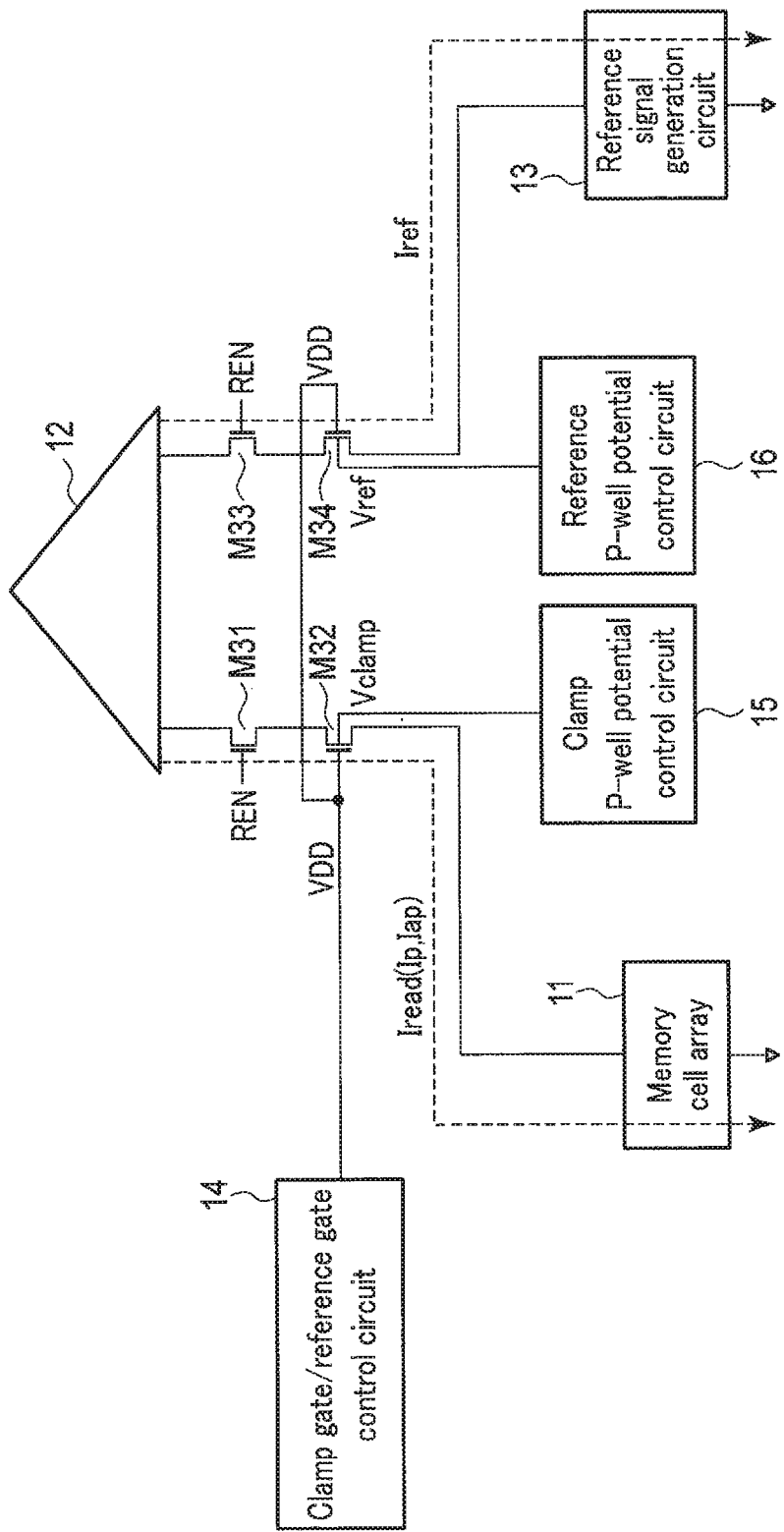
F I G. 8

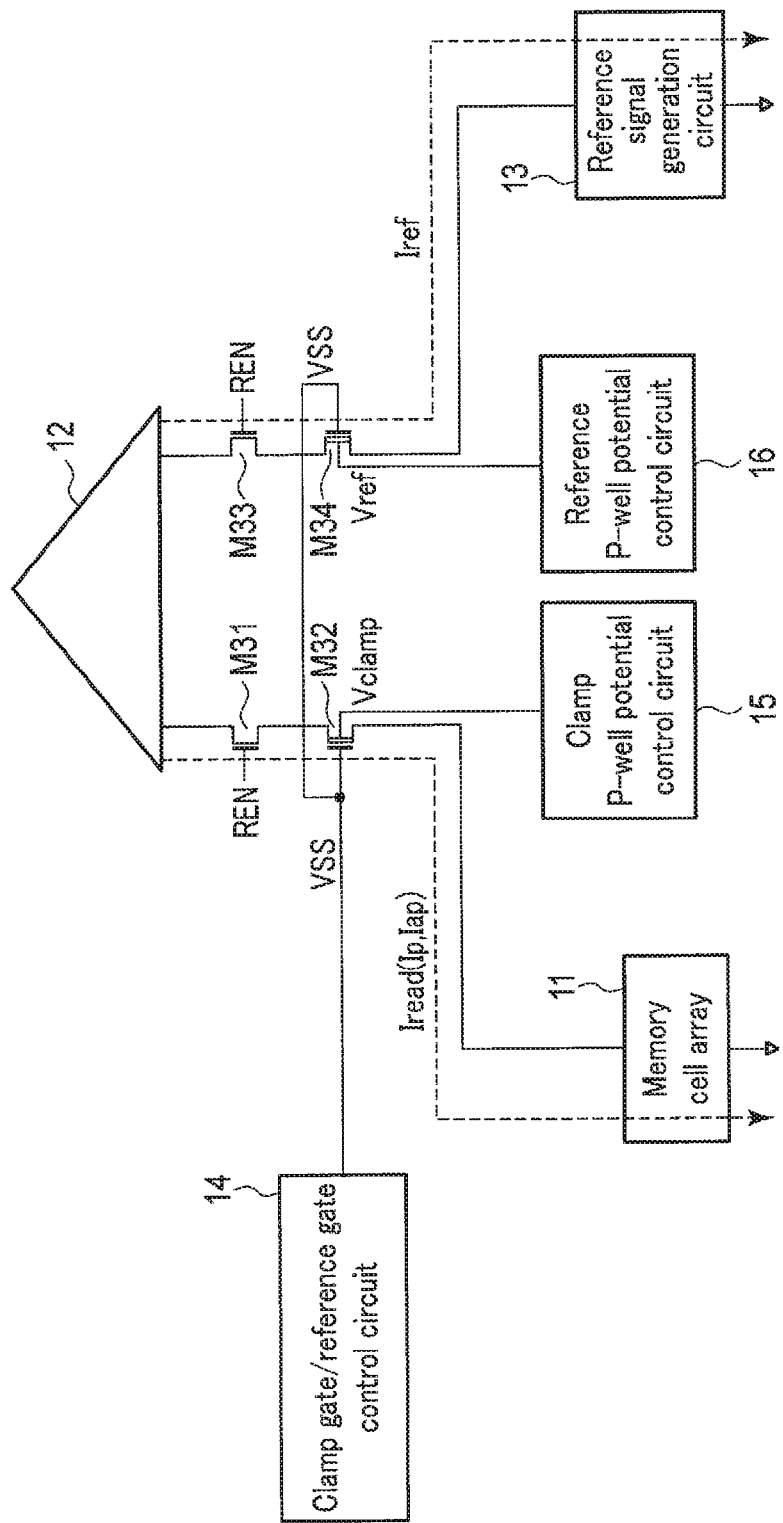
F I G. 10

SEMICONDUCTOR MEMORY DEVICE FOR SENSING MEMORY CELL WITH VARIABLE RESISTANCE

CROSS REFERENCE TO RELATED APPLICATIONS

This application is based upon and claims the benefit of priority from U.S. Provisional Application No. 62/209,673, filed Aug. 25, 2015, the entire contents of all of which are incorporated herein by reference.

FIELD

Embodiments relate to a semiconductor memory device.

BACKGROUND

An MRAM (Magnetic Random Access Memory) employs, as a memory cell, an MTJ (Magnetic Tunnel Junction) element having a magnetoresistive effect. The MRAM has features of a high-speed operation, a large capacity and nonvolatility, and attracts attention as a next-generation memory device.

BRIEF DESCRIPTION OF THE DRAWINGS

FIG. 1 is a circuit diagram illustrating a configuration example of a semiconductor memory device according to a first embodiment;

FIG. 2A is a cross-sectional view illustrating a configuration example of a variable resistance element in the semiconductor memory device according to the first embodiment;

FIG. 2B is a view for describing a write operation of the variable resistance element in the semiconductor memory device according to the first embodiment, FIG. 2B being a cross-sectional view of the variable resistance element in a parallel state;

FIG. 2C is a view for describing a write operation of the variable resistance element in the semiconductor memory device according to the first embodiment, FIG. 2C being a cross-sectional view of the variable resistance element in an antiparallel state;

FIG. 3 is a circuit diagram illustrating a clamp P-well potential control circuit of the semiconductor memory device according to the first embodiment;

FIG. 4 is a circuit diagram illustrating a reference P-well potential control circuit of the semiconductor memory device according to the first embodiment;

FIG. 8 is a view illustrating various voltages of a memory cell path and a reference path at a time of a read operation in the semiconductor memory device according to the first embodiment;

FIG. 10 is a circuit diagram illustrating a configuration example of a semiconductor memory device according to a second embodiment.

DETAILED DESCRIPTION

Figure 5:
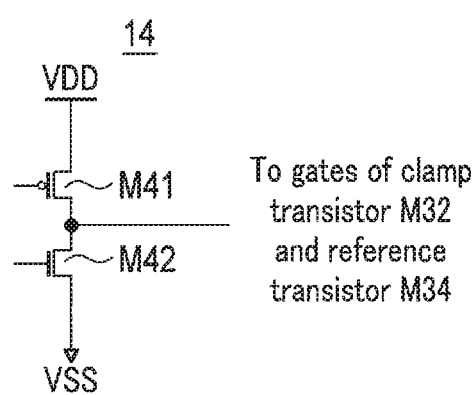
FIG. 5 is a circuit diagram illustrating a clamp gate/reference gate control circuit of the semiconductor memory device according to the first embodiment.

In general, according to one embodiment, a semiconductor memory device includes a memory cell which includes a variable resistance element; a reference signal generation circuit configured to generate a reference signal; a sense amplifier including a first input terminal and a second input terminal; a first transistor configured to electrically couple the memory cell and the first input terminal of the sense amplifier; a second transistor configured to electrically couple the reference signal generation circuit and the second input terminal of the sense amplifier; a first control circuit configured to supply a voltage to gates of the first transistor and the second transistor; a second control circuit configured to supply a first voltage except 0V to a back gate of the first transistor; and a third control circuit configured to supply a second voltage except 0V to a back gate of the second transistor.

Embodiments will be described hereinafter with reference to the accompanying drawings. In the drawings, the same parts are denoted by like reference numerals.

<First Embodiment>

Referring now to FIG. 1 to FIG. 5, a description is given of a semiconductor memory device according to a first embodiment. In the first embodiment, a power supply voltage VDD is applied to the gates of a clamp transistor M32 and a reference transistor M34. In addition, a reference voltage Vref of an M level, which is variable in accordance with temperatures, is applied to the back gate of the reference transistor M34. Thereby, robustness can be enhanced against a power supply bounce (potential variation), a read operation speed can be increased, and a read margin can be increased regardless of a temperature variation. The first embodiment will be described below in detail.

[Configuration Example in the First Embodiment]

To begin with, referring to FIG. 1 to FIG. 3, a configuration example of the semiconductor memory device according to the first embodiment is described. Here, a description is given of, by way of example, an MRAM which stores data by using a magnetoresistive effect element (MTJ element) as a variable resistance element, but the embodiment is not limited to this. The embodiment is generally applicable to memories configured such that a difference in resistance of the variable resistance element is converted to a difference in current or a difference in voltage, and the difference in current or difference in voltage is sensed.

FIG. 1 is a circuit diagram illustrating a configuration example of the semiconductor memory device according to the first embodiment.

As illustrated in FIG. 1, the semiconductor memory device includes a memory cell array 11, a sense amplifier 12, a reference signal generation circuit 13, a clamp gate/reference gate control circuit 14, a clamp P-well potential control circuit 15, and a reference P-well potential control circuit 16.

The memory cell array 11 includes a plurality of memory cells MC. The respective memory cells MC are disposed at positions of intersection between local bit lines LBL<0> to LBL<n> and local source lines LSL<0> to LSL<n>, on one hand, and word lines WL<0> to WL<n>, on the other hand. Specifically, the plural memory cells MC are arranged in a matrix. Incidentally, n denotes 0, 1, 2, . . . , n.

The memory cell MC includes, for example, a variable resistance element RE and a select transistor ST. One end of the variable resistance element RE is electrically coupled to the local bit line LBL, and the other end thereof is electrically coupled to one end of the select transistor ST. The other end of the select transistor ST is electrically coupled to the local source line LSL. The gate of the select transistor ST is electrically coupled to the word line WL. The memory cell MC is selected by the select transistor ST being turned on by the word line WL.

The variable resistance element RE is an element having a resistance value varied when an electric current (or a voltage) is applied thereto. The variable resistance element RE includes, for example, an MTJ element, a phase change element, or a ferroelectric element. Here, the case in which the variable resistance element RE is an MTJ element is described.

FIG. 2A is a cross-sectional view illustrating a configuration example of the variable resistance element RE in the semiconductor memory device according to the first embodiment. Here, as regards the variable resistance element RE, a memory layer 42, a tunnel barrier layer 43 and a reference layer 44 are mainly illustrated.

As illustrated in FIG. 2A, the variable resistance element RE includes a multilayer structure. The multiplayer structure includes the memory layer 42, tunnel barrier layer 43 and reference layer 44. The tunnel barrier layer 43 is provided between the memory layer 42 and reference layer 44.

The memory layer 42 is a ferromagnetic layer with a variable magnetization direction, and has a vertical magnetic anisotropy. Here, the "vertical magnetic anisotropy" indicates that the magnetization direction is vertical or substantially vertical to the film surface (upper surface/lower surface). In addition, the "variable magnetization direction" indicates that the magnetization direction varies relative to a predetermined write current. Besides, the "substantially vertical" means that the direction of residual magnetization is in a range of $45°<\theta≤90°$ relative to the film surface.

The tunnel barrier layer 43 is provided on the memory layer 42. The tunnel barrier layer 43 is a nonmagnetic layer, and is formed of, e.g. MgO.

The reference layer 44 is provided on the tunnel barrier layer 43. The reference layer 44 is a ferromagnetic layer with an invariable magnetization direction, and has a vertical magnetic anisotropy. Here, the "invariable magnetization direction" indicates that the magnetization direction does not vary relative to a predetermined write current. Specifically, the reference layer 44 has a greater inversion energy barrier in the magnetization direction than the memory layer 42.

FIG. 2B is a view for describing a write operation of the variable resistance element RE in the semiconductor memory device according to the first embodiment, FIG. 2B being a cross-sectional view of the variable resistance element RE in a parallel state (P state). FIG. 2C is a view for describing a write operation of the variable resistance element RE in the semiconductor memory device according to the first embodiment, FIG. 2C being a cross-sectional view of the variable resistance element RE in an antiparallel state (AP state).

The variable resistance element RE is, for example, a spin-transfer-type magnetoresistive effect element. Thus, when data is written to the variable resistance element RE or when data is read from the variable resistance element RE, current flows through the variable resistance element RE in both directions vertical to the film surface.

To be more specific, data write to the variable resistance element RE is executed as follows.

As illustrated in FIG. 2B, when current flows from the memory layer 42 to the reference layer 44, that is, when electrons flowing from the reference layer 44 to the memory layer 42 are supplied, electrons that are spin-polarized in the same direction as the magnetization direction of the reference layer 44 are injected in the memory layer 42. In this case, the magnetization direction of the memory layer 42 is made to agree with the magnetization direction of the reference layer 44. Thereby, the magnetization direction of the reference layer 44 and the magnetization direction of the memory layer 42 are set in a parallel state. In this parallel state, the resistance value of the variable resistance element RE becomes minimum. This case is defined, for example, as "0" data.

On the other hand, as illustrated in FIG. 2C, when current flows from the reference layer 44 to the memory layer 42, that is, when electrons flowing from the memory layer 42 to the reference layer 44 are supplied, electrons are reflected by the reference layer 44. Thereby, electrons, which are spin-polarized in a direction opposite to the magnetization direction of the reference layer 44, are injected in the memory layer 42. In this case, the magnetization direction of the memory layer 42 is made opposite to the magnetization direction of the reference layer 44. Thereby, the magnetization direction of the reference layer 44 and the magnetization direction of the memory layer 42 are set in an antiparallel state. In this antiparallel state, the resistance value of the variable resistance element RE becomes maximum. This case is defined, for example, as "1" data.

In addition, data read from the variable resistance element RE is executed as follows.

A read current is supplied to the variable resistance element RE. This read current is set at a value at which the magnetization direction of the memory layer 42 is not reversed (a value which is less than the value of the write current). By detecting a variation in resistance value of the variable resistance element RE at this time, the above-described "0" data and "1" data can be read.

Referring back to FIG. 1, one end of the local source line, LSL<0> to LSL<n>, is electrically coupled to a global source line GSL via a column select transistor, M2<0> to M2<n>. A column select signal, CSL<0> to CSL<n>, is supplied to the gate of the column select transistor, M2<0> to M2<n>.

The global source line GSL is electrically coupled to a ground voltage VSS via an nMOS transistor M3. A signal SINK is supplied to the gate of the nMOS transistor M3. In addition, the global source line GSL is electrically coupled to a ground voltage VSS via an nMOS transistor M8. A discharge signal DIS is supplied to the gate of the nMOS transistor M8.

One end of the local bit line, LBL<0> to LBL<n>, is electrically to a global bit line GBL via a column select transistor, M1<0> to M1<n>. A column select signal, CSL<0> to CSL<n>, is supplied to the gate of the column select transistor, M1<0> to M1<n>.

The global bit line GBL in the memory cell array 11 is electrically coupled to a first input terminal 12A of the sense amplifier 12 (a connection node between nMOS transistors M12 and M15 in the sense amplifier 12) via a memory cell path. The memory cell path includes a read enable transistor M31 that is an nMOS transistor, and a clamp transistor M32 that is an nMOS transistor. The read enable transistor M31 and clamp transistor M32 constitute a current path in series. In addition, the global bit line GBL is electrically coupled to a ground voltage VSS via an nMOS transistor M6. A discharge signal DIS is supplied to the gate of the nMOS transistor M6.

The reference signal generation circuit 13 includes, for example, a reference cell in which "1" data is stored, and a reference cell in which "0" data is stored. By using these reference cells, the reference signal generation circuit 13 generates a reference signal (reference current) which is an intermediate signal between the "1" data and "0" data. The reference signal generation circuit 13 is electrically coupled to a second input terminal 12B of the sense amplifier 12 (a connection node between nMOS transistors M14 and M16 in the sense amplifier 12) via a reference path. The reference path includes a read enable transistor M33 that is an nMOS transistor, and a reference transistor M34 that is an nMOS transistor. The read enable transistor M33 and clamp transistor M34 constitute a current path in series.

In the meantime, the reference signal generation circuit 13 may include a fixed resistor, instead of the reference cells, and may generate a reference signal by this fixed resistor. In addition, in this example, since the sensor amplifier 12 is of a current detection type, the reference signal generation circuit 13 generates the reference current. However, if the sense amplifier 12 is of a voltage detection type, the reference signal generation circuit 13 generates a reference voltage.

The sensor amplifier 12 is, for example, a current detection-type sense amplifier. The sense amplifier 12 includes a first inverter, a second inverter, nMOS transistors M15 and M16, pMOS transistors M17 and M18, a first pass transistor, and a second pass transistor.

The first inverter includes a pMOS transistor M11 and an nMOS transistor M12. The first inverter includes a first input terminal, a first output terminal, and first and second voltage terminals. The second inverter includes a pMOS transistor M13 and an nMOS transistor M14. The second inverter includes a second input terminal, a second output terminal, and third and fourth voltage terminals.

The first voltage terminal (one end of pMOS transistor M11) and the third voltage terminal (one end of pMOS transistor M13) are electrically coupled to a power supply voltage VDD. The second input terminal (gates of pMOS transistor M13 and nMOS transistor M14) is electrically coupled to the first output terminal (the other end of pMOS transistor M11 and one end of nMOS transistor 12). The second output terminal (the other end of pMOS transistor M13 and one end of nMOS transistor M14) is electrically coupled to the first input terminal (gates of pMOS transistor M11 and nMOS transistor M12).

The first pass transistor includes an nMOS transistor M19 and a pMOS transistor M20. The second pass transistor includes an nMOS transistor M21 and a pMOS transistor M22.

One end of the pMOS transistor (sense enable transistor) M17 is electrically coupled to the first output terminal of the first inverter, and the other end of the pMOS transistor M17 is electrically coupled to the power supply voltage VDD. One end of the pMOS transistor (sense enable transistor) M18 is electrically coupled to the second output terminal of the second inverter, and the other end of the pMOS transistor M18 is electrically coupled to the power supply voltage VDD. A sense enable signal SEN1 is supplied to the gates of the pMOS transistors M17 and M18.

In addition, the first pass transistor (transistor M19, M20) is electrically coupled to the first output terminal of the first inverter. Output enable signals SOE and SOEb are supplied to the gates of the transistors M19 and M20, respectively. The second pass transistor (transistor M21, M22) is electrically coupled to the second output terminal of the second inverter. Output enable signals SOE and SOEb are supplied to the gates of the transistors M21 and M22, respectively.

One end of the nMOS transistor M15 is electrically coupled to the second voltage terminal (the other end of transistor M12) of the first inverter, and the other end of the nMOS transistor M15 is electrically coupled to a ground voltage VSS. One end of the nMOS transistor M16 is electrically coupled to the fourth voltage terminal (the other end of transistor M14) of the second inverter, and the other end of the nMOS transistor M16 is electrically coupled to the ground voltage VSS. A sense enable signal is supplied to the gates of the nMOS transistors M15 and M16.

The second voltage terminal (the other end of transistor M12, i.e. the first input terminal 12A of sense amplifier 12) of the first inverter is electrically coupled to one end of the read enable transistor M31. The other end of the read enable transistor M31 is electrically coupled to one end of the clamp transistor M32. The other end of the clamp transistor M32 is electrically coupled to the global bit line GBL of the memory cell array 11.

Besides, the fourth voltage terminal (the other end of transistor M14, i.e. the second input terminal 12B of sense amplifier 12) of the second inverter is electrically coupled to one end of the read enable transistor M33. The other end of the read enable transistor M33 is electrically coupled to one end of the reference transistor M34. The other end of the reference transistor M34 is electrically coupled to the reference signal generation circuit 13.

Read enable signals REN are supplied from a REN control circuit (not shown) to the gates of the read enable transistors M31 and M33, respectively.

A power supply voltage VDD or a ground voltage VSS is supplied by the clamp gate/reference gate control circuit 14 to the gates of the clamp transistor M32 and reference transistor M34. A clamp voltage Vclamp is supplied by the clamp P-well potential control circuit 15 to the back gate (P-well (P-substrate)) of the clamp transistor M32. A reference voltage Vref is supplied by the reference P-well potential control circuit 16 to the reference transistor M34.

Incidentally, the P-well of the clamp transistor M32 and the P-well of the reference transistor M34 are mutually isolated (well-isolated). In addition, the P-well of the clamp transistor M32 and the P-well of the reference transistor M34 are isolated from the well of the other transistors on the same semiconductor chip. Thereby, voltages can independently be applied to the P-well of the clamp transistor M32 and the P-well of the reference transistor M34.

FIG. 3 is a circuit diagram illustrating the clamp P-well potential control circuit 15 of the semiconductor memory device according to the first embodiment.

As illustrated in FIG. 3, the clamp P-well potential control circuit 15 includes a first circuit 15A and a second circuit 15B.

The first circuit 15A generates a clamp voltage Vclamp that is a negative voltage. The first circuit 15A includes resistors 15A_1 and 15A_2, an operational amplifier 15A_3, and a negative voltage generation pump 15A_4.

One end of the resistor 15A_1 is electrically coupled to a voltage VDDX, and the other end thereof is electrically coupled to one end of the resistor 15A_2. The other end of the resistor 15A_2 is electrically coupled to an output terminal of the negative voltage generation pump 15A_4. A voltage VrefX is input to a first input terminal (− terminal) of the operational amplifier 15A_3, and a voltage Vx is input to a second input terminal (+ terminal) thereof. The voltage Vx is a voltage at connected ends of the resistors 15A_1 and 15A_2. An output terminal of the operational amplifier 15A_3 is electrically coupled to an input terminal of the negative voltage generation pump 15A_4, and the output terminal of the negative voltage generation pump 15A_4 is electrically coupled to the back gate of the clamp transistor M32.

The second circuit 15B regulates the clamp voltage Vclamp by charging it to the VDD side, when the clamp voltage Vclamp has been excessively increased to negative side by the first circuit 15A. The second circuit 15B includes resistors 15B_1, 15B_2 and 15B_5, an operational amplifier 15B_3, and a PMOS transistor 15B_4.

One end of the resistor 15B_1 is electrically coupled to a voltage VDDX, and the other end thereof is electrically coupled to one end of the resistor 15B_2. The other end of the resistor 15B_2 is electrically coupled to one end of the resistor 15B_5. A voltage VrefX is input to a first input terminal (− terminal) of the operational amplifier 15B_3, and a voltage Vy is input to a second input (+ terminal) terminal thereof. The voltage Vy is a voltage at connected ends of the resistors 15B_1 and 15B_2. An output terminal of the operational amplifier 15B_3 is electrically coupled to the gate of the PMOS transistor 15B_4. One end of the PMOS transistor 15B_4 is coupled to a power supply voltage VDD, and the other end thereof is electrically coupled to the other end of the resistor 15B_5. One end of the resistor 15B_5 is electrically coupled to the back gate of the clamp transistor M32.

The clamp P-well potential control circuit 15 operates as follows.

In the first circuit 15A, the voltage VrefX is input to the first input terminal of the operational amplifier 15A_3, and the voltage Vx is input to the second input terminal thereof. The voltage VrefX is a reference voltage and has a temperature characteristic. The voltage Vx is a feedback voltage based on the clamp voltage Vclamp. To be more specific, the voltage Vx is a voltage which has been adjusted by voltage division of the clamp voltage Vclamp and voltage VDDX by the resistors 15A_1 and 15A_2.

When the voltage Vx has become greater than the voltage VrefX, the operational amplifier 15A_3 outputs an H-level voltage (e.g. power supply voltage VDD). By this voltage, the negative voltage generation pump 15A_4 is driven. Thereby, the negative voltage generation pump 15A_4 outputs the clamp voltage Vclamp that is a negative voltage.

This clamp voltage Vclamp is generated according to the following equation (1).

$$VrefX=(R2/(R1+R2))(VDDX-Vclamp) \quad (1)$$

Here, R1 is the resistance of the resistor 15A_1, and R2 is the resistance of the resistor 15A_2. Specifically, the following equation (2) is established.

$$Vclamp=VDDX-((R1+R2)/R2)VrefX \quad (2)$$

If equation (2) is differentiated by temperature T, the following equation (3) is obtained.

$$dVclamp/dT=dVDDX/dT-((R1+R2)/R2)dVrefX/dT \quad (3)$$

By properly setting the values of voltage VDDX and voltage VrefX and the temperature dependency (dVDDX/dT, dVrefX/dT) in these equations (2) and (3), it becomes possible to generate the clamp voltage Vclamp having a desired absolute value and temperature dependency.

On the other hand, when the clamp voltage Vclamp has excessively increased to the negative side in the first circuit 15A, the second circuit 15B operates. In the second circuit 15B, the voltage VrefX is input to the first input terminal of the operational amplifier 15B_3, and the voltage Vy is input to the second input terminal. The voltage Vy is a feedback voltage based on the clamp voltage Vclamp. To be more specific, the voltage Vy is a voltage which has been adjusted by voltage division of the clamp voltage Vclamp and voltage VDDX by the resistors 15B_1 and 15B_2. The voltage Vy is adjusted so as to become smaller than the voltage Vx. Thereby, it becomes possible to prevent the first circuit 15A and second circuit 15B from being driven (activated) at the same time, and an excess through-current from flowing.

When the voltage Vy has become smaller than the voltage VrefX, the operational amplifier 15B_3 outputs an L-level voltage (e.g. ground voltage VSS). By this voltage being supplied to the gate of the PMOS transistor 15B_4, the PMOS transistor 15B_4 is turned on. Thereby, the clamp voltage Vclamp that is the negative voltage is charged to the power supply voltage VDD side and is adjusted.

In this manner, the clamp P-well potential control circuit 15 supplies the clamp voltage Vclamp to the back gate of the clamp transistor M32. The clamp voltage Vclamp is a negative voltage (e.g. about 0~−0.5 V) of an M level which is variable in accordance with temperatures. The clamp voltage Vclamp is controlled at a proper value, for example, so as to compensate a temperature characteristic variation of the threshold voltage of the clamp transistor M32. The clamp voltage Vclamp that is the negative voltage is applied to the back gate of the clamp transistor M32, and thereby the threshold thereof is raised in a pseudo-manner. Here, the M level is a level, the absolute value of which is set between the absolute value of H level and the absolute value of L level.

FIG. 4 is a circuit diagram illustrating the reference P-well potential control circuit 16 of the semiconductor memory device according to the first embodiment.

As illustrated in FIG. 4, the reference P-well potential control circuit 16 has the same configuration and performs the same operation as the clamp P-well potential control circuit 15. Specifically, the reference P-well potential control circuit 16 includes a first circuit 16A and a second circuit 16B. The first circuit 16A generates a reference voltage Vref that is a negative voltage. The first circuit 16A includes resistors 16A_1 and 16A_2, an operational amplifier 16A_3, and a negative voltage generation pump 16A_4. The second circuit 16B includes resistors 16B_1, 16B_2 and 16B_5, an operational amplifier 16B_3, and a PMOS transistor 16B_4.

The reference P-well potential control circuit 16 supplies a reference voltage Vref to the back gate of the reference transistor M34. The reference voltage Vref is a negative voltage (e.g. about 0~−0.5 V) of an M level which is variable in accordance with temperatures. The reference voltage Vref is controlled at a proper value, for example, so as to compensate a temperature dependency of the resistance of the memory cell MC. The reference voltage Vref that is the negative voltage is applied to the back gate of the reference transistor M34, and thereby the threshold thereof is raised in a pseudo-manner.

FIG. 5 is a circuit diagram illustrating the clamp gate/reference gate control circuit 14 of the semiconductor memory device according to the first embodiment.

As illustrated in FIG. 5, the clamp gate/reference gate control circuit 14 includes an nMOS transistor M42 and a pMOS transistor M41. One end of the pMOS transistor M41 is electrically coupled to a power supply voltage VDD, and the other end thereof is electrically coupled to one end of the nMOS transistor M42. The other end of the nMOS transistor M42 is electrically coupled to a ground voltage VSS. Connected ends of the pMOS transistor M41 and nMOS transistor M42 (the other end of pMOS transistor M41 and one end of nMOS transistor M42) are coupled to the gates of the clamp transistor M32 and reference transistor M34. The clamp gate/reference gate control circuit 14 supplies a power supply voltage VDD (e.g. 1.2 V) or a ground voltage VSS (e.g. 0 V) to the gates of the clamp transistor M32 and reference transistor M34 from the connected ends of the pMOS transistor M41 and nMOS transistor M42.

In the meantime, as will be described later, in the first embodiment, the power supply voltage VDD is applied, in the read operation, to the gates of the clamp transistor M32 and reference transistor M34. In addition, the power supply voltage VDD may be applied to the gates of the clamp transistor M32 and reference transistor M34, not only when the read operation is executed, but at all times. Thus, in the first embodiment, the power supply voltage VDD may directly be electrically coupled to the gates of the clamp transistor M32 and reference transistor M34, without intervention of the transistors as the clamp gate/reference gate control circuit 14.

Figure 6:
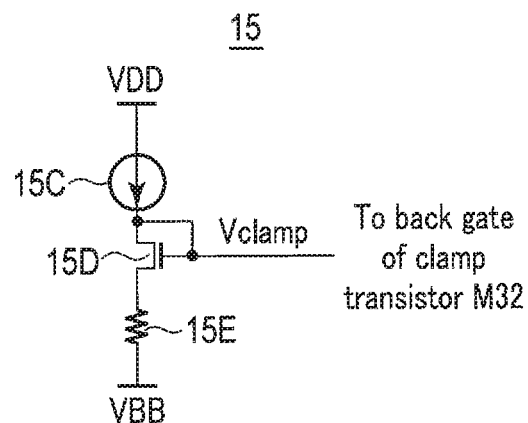
FIG. 6 is a circuit diagram illustrating a modification of the clamp P-well potential control circuit of the semiconductor memory device according to the first embodiment.

FIG. 6 is a circuit diagram illustrating a modification of the clamp P-well potential control circuit 15 of the semiconductor memory device according to the first embodiment.

The clamp P-well potential control circuit 15 in the modification includes a constant-current source 15C, an nMOS transistor 15D, and a variable resistor 15E. The constant-current source 15C is electrically coupled to the power supply voltage, and causes a low current to flow. One end and the gate of the nMOS transistor 15D are electrically coupled, and are diode-connection. The one end of the nMOS transistor 15D is electrically coupled to the constant-current source 15C. In addition, the other end of the nMOS transistor 15D is electrically coupled to one end of the variable resistor 15E, and the other end of the variable resistor 15E is electrically coupled to a voltage VBB. The voltage VBB is a negative voltage and is generated by, for example, the first circuit 15A, 16A illustrated in FIG. 3, 4. The gate of the nMOS transistor 15D is electrically coupled to the back gate of the clamp transistor M32. The clamp P-well potential control circuit 15 supplies a clamp voltage Vclamp from the gate of the nMOS transistor 15D to the back gate of the clamp transistor M32.

Figure 7:
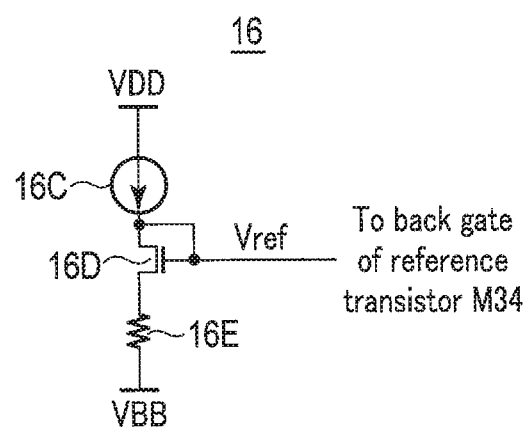
FIG. 7 is a circuit diagram illustrating a modification of the reference P-well potential control circuit of the semiconductor memory device according to the first embodiment.

FIG. 7 is a circuit diagram illustrating a modification of the reference P-well potential control circuit 16 of the semiconductor memory device according to the first embodiment.

The reference P-well potential control circuit 16 in the modification includes a constant-current source 16C, an nMOS transistor 16D, and a variable resistor 16E. The constant-current source 16C is electrically coupled to the power supply voltage, and causes a low current to flow. One end and the gate of the nMOS transistor 16D are electrically coupled, and are diode-connection. The one end of the nMOS transistor 16D is electrically coupled to the constant-current source 16C. In addition, the other end of the nMOS transistor 16D is electrically coupled to one end of the variable resistor 16E, and the other end of the variable resistor 16E is electrically coupled to a voltage VBB. The gate of the nMOS transistor 16D is electrically coupled to the back gate of the reference transistor M34. The reference P-well potential control circuit 16 supplies a reference voltage Vref from the gate of the nMOS transistor 16D to the back gate of the reference transistor M34.

[Example of Read Operation in the First Embodiment]

Figure 9:
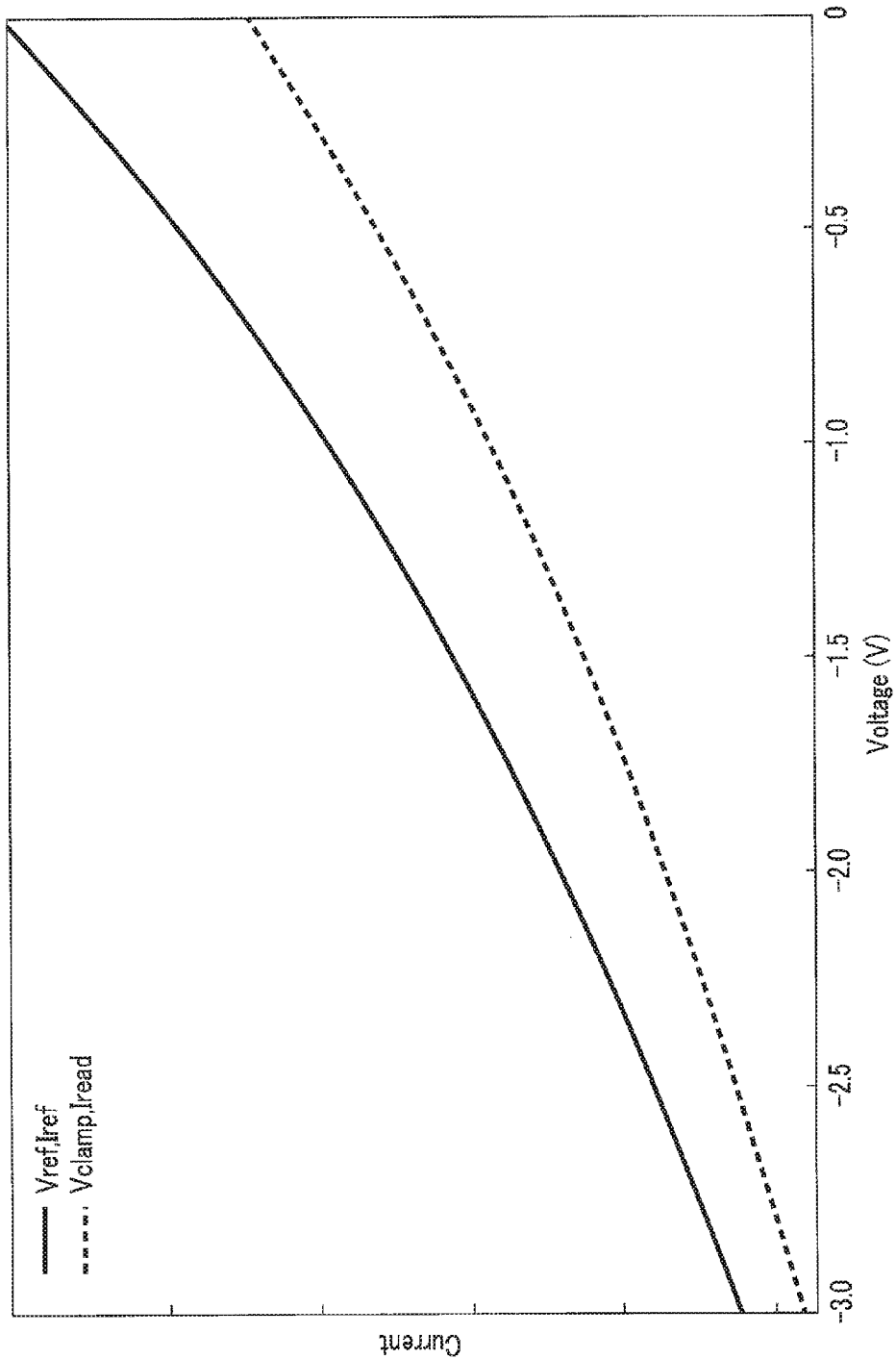
FIG. 9 is a graph illustrating a relationship between a clamp voltage and a read current, and a relationship between a reference voltage and a reference current, in the semiconductor memory device according to the first embodiment.

Next, referring to FIG. 1, FIG. 8 and FIG. 9, an example of the read operation in the first embodiment is described.

The respective signals and operations in a standby state prior to the start of the read operation are as follows.

The sense enable signal SEN1 is at L level, and the sense enable transistors M17 and M18 are in the ON state. The discharge signal DIS is at H level, and the discharge transistors M6 and M8 are in the ON state.

In addition, the word line WL, column select signal CSL<n>, signal SINK, sense enable signal SEN2 and signal SOE are at L level, and the signal SOEb is at H level. Thereby, the MOS transistors, which are coupled to these signals, enter the OFF state. In addition, the read enable signal REN is at L level, and thereby the read enable transistors M31 and M33 enter the OFF state. Besides, the power supply voltage VDD is applied to the gates of the clamp transistor M32 and reference transistor M34, and the clamp transistor M32 and reference transistor M34 enter the ON state.

The respective signals and operations in the read operation are as follows.

In the sense amplifier 12 in the initial state, the sense enable signal SEN1 is at L level, and the node SO and node SOb are precharged to the power supply voltage VDD.

In the memory cell array 11, the column select signal CSL<n> is at H level, and the local bit line LBL<n> and local source line LSL<n> are selected. Further, the word line WL<n> is driven, and the memory cell MC that is a read target is selected. Moreover, the discharge signal DIS lowers to L level, and the discharge transistors M6 and M8 enter the OFF state. The signal SINK rises to H level, and the sink transistor M3 enters the ON state. The timing at which the sink transistor M3 is set in the ON state may be a timing before a read current is caused to flow to the memory cell MC.

In addition, the read enable signal REN rises to H level, and the read enable transistors M31 and M33 enter the ON state. Specifically, the memory cell path and reference path are rendered conductive.

Next, the sense enable signal SEN1 rises to H level, and the sense enable transistors M17 and M18 enter the OFF state. Thereby, the precharge of the node SO and node SOb is stopped. As a result, the read current becomes a current which is supplied from only the power supply voltage VDD that is coupled to one end of the nMOS transistor M11, M13. At this time, the read current varies in accordance with the data ("0" or "1") stored in the selected memory cell. Specifically, the read current varies according to whether the selected memory cell is in a low resistance state or in a high resistance state.

Thereafter, the sense enable signal SEN2 rises to H level, and the sense enable transistors M15 and M16 enter the ON state. Thereby, the current (read current) flowing to the first input terminal 12A of the sense amplifier 12 and the current (reference current) flowing to the second input terminal 12B are compared. Then, in accordance with a comparison result, H level or L level is held in a latch circuit which is composed of the pMOS transistors M11 and M13 and nMOS transistors M12 and M14.

At last, the output enable signal SOE rises to H level, the output enable signal SOEb lowers to L level, and the nMOS transistors M19 and M21 and the pMOS transistors M20 and M22 enter the ON state. Thereby, the H level or L level, which is latched in the latch circuit, is output as an output signal OUT, OUTb from the node SO, SOb.

In the meantime, the description has been given of the present example in which the sense amplifier 12 is the current detection-type sense amplifier which detects the reference current, but there is no restriction to this example. The sense amplifier 12 may be a voltage detection-type sense amplifier which detects a reference voltage. In this case, the reference signal generation circuit 13 generates a reference voltage as the reference signal.

Hereinafter, various voltages of the memory cell path and reference path at the time of the read operation will be described in greater detail.

FIG. 8 is a view illustrating various voltages of the memory cell path and reference path at the time of the read operation in the semiconductor memory device according to the first embodiment.

As illustrated in FIG. 8, in the reference path at the time of the read operation, the read enable signal REN of H level is supplied to the gate of the read enable transistor M33, and the power supply voltage VDD is supplied to the gate of the reference transistor M34. Here, the threshold voltage Vthb of the reference transistor M34 is a positive voltage. Thereby, the read enable transistor M33 and reference transistor M34 enter the ON state, and a voltage "VDD−Vthb" is transferred to the other end side (reference signal generation circuit 13 side) of the reference transistor M34. As a result, in accordance with the voltage "VDD−Vthb" that is transferred, a reference current Iref flows through the reference path.

At this time, for example, in a case of high temperatures, the resistance of the memory cell MC with "0" data (in the low resistance state) does not vary, and the resistance of the memory cell MC with "1" data (in the high resistance state) decreases. Thus, an intermediate value between the "1" data and "0" data decreases. Accordingly, the reference current Iref of the reference path becomes greater (closer to the value of "1" data) than an optimal point (intermediate value between "1" data and "0" data). As a result, the read margin becomes smaller, and the possibility of erroneous sense (read) increases.

Here, the threshold voltage in the case in which the substrate is Si is expressed by the following equation (4).

$$Vthb = Vfb + 2\phi b + (2\epsilon_{si} qNa(2\phi b - Vsub)/Cox)^{1/2} \quad (4)$$

Vfb: a flat band voltage of a gate MOS capacitor of the associated NMOS transistor
φb: a potential between the Fermi level of Si and intrinsic level
Na: a substrate impurity concentration
q: elementary electric charge
Cox: gate oxide film capacitance
Vsub: back gate bias (substrate voltage).

Specifically, the threshold voltage Vthb depends on the back gate bias Vsub. To be more specific, as the back gate bias Vsub is made greater to the negative side (i.e. to the negative side with a larger absolute value), the threshold voltage Vthb becomes larger. Accordingly, by controlling the back gate bias Vsub, the threshold voltage Vthb can be controlled.

In the first embodiment, the reference voltage Vref is applied as the back gate bias Vsub of the reference transistor M34. As described above, the reference voltage Vref is a negative voltage of M level which is variable in accordance with temperatures. By applying the reference voltage Vref that is the negative voltage to the back gate of the reference transistor M34, the threshold voltage Vthb of the reference transistor M34 can be increased in a pseudo-manner. As a result, the transferred voltage [VDD−vthb] becomes smaller than in the case in which the reference voltage Vref is not applied. Thus, the reference current Iref of the reference path can be decreased, and a deviation of the optimal point due to a temperature variation can be compensated. Accordingly, the read margin can be increased, and erroneous read can be suppressed.

On the other hand, as illustrated in FIG. 8, in the memory cell path at the time of the read operation, the read enable signal REN of H level is supplied to the gate of the read enable transistor M31, and the power supply voltage VDD is supplied to the gate of the clamp transistor M32. Here, the threshold voltage Vtha of the clamp transistor M32 is a positive voltage. Thereby, the read enable transistor M31 and clamp transistor M32 enter the ON state, and a voltage [VDD−Vtha] is transferred to the other end side (memory cell array 11 side) of the clamp transistor M32. As a result, in accordance with the transferred voltage [VDD−Vtha], a read current Iread (parallel current Ip or antiparallel current Iap) flows through the memory cell path.

At this time, for example, in the case of high temperatures, the threshold voltage Vtha of the clamp transistor M32 decreases. Thus, the transferred voltage [VDD−Vtha] increases (read current Iread increases). As a result, so-called read disturb, in which the data of the memory cell is inverted, occurs.

Here, the threshold voltage Vtha is expressed like the above-described equation (1).

Specifically, the threshold voltage Vtha depends on the back gate bias Vsub. To be more specific, as the substrate voltage Vsub is made greater to the negative side (i.e. to the negative side with a larger absolute value), the threshold voltage Vthb becomes larger (Vtha∞[−Vsub]). Accordingly, by controlling the back gate bias Vsub, the threshold voltage Vtha can be controlled.

In the first embodiment, the clamp voltage Vclamp is applied as the back gate bias Vsub of the clamp transistor M32. As described above, the clamp voltage Vclamp is a negative voltage of M level which is variable. By applying the clamp voltage Vclamp that is the negative voltage to the back gate of the clamp transistor M32, the threshold voltage Vtha of the clamp transistor M32 can be increased in a pseudo-manner. As a result, the transferred voltage [VDD−Vtha] becomes smaller than in the case in which the clamp voltage Vclamp is not applied. Thus, even if the threshold voltage Vtha decreases due to high temperatures, this can be compensated by the negative clamp voltage Vclamp. Specifically, even at high temperatures, it is possible to suppress an increase of the transferred voltage [VDD−Vtha] (read current Iread), and to suppress read disturb of the memory cell.

In the meantime, in the first embodiment, since the voltage VDD of H level is applied to the gate of the clamp transistor M32, the read current Iread increases, and read disturb of the memory cell tends to easily occur. Although the threshold voltage is raised in a pseudo-manner by applying the clamp voltage Vclamp that is the negative voltage to the back gate of the clamp transistor M32, there is a case in which this is insufficient. It is thus desirable to set the threshold voltage Vtha of the clamp transistor M32 such that the threshold voltage Vtha is higher than the threshold voltage of an nMOS transistor (e.g. read enable transistor M31) which is a constituent of another functional circuit on the same semiconductor chip. The threshold voltage Vtha of the clamp transistor M32 is adjusted by, for example, ion implantation.

Additionally, like the threshold voltage Vtha of the clamp transistor M32, it is desirable to set the threshold voltage Vthb of the reference transistor M34 such that the threshold voltage Vthb is higher than the threshold voltage of another nMOS transistor (e.g. read enable transistor M33) on the same semiconductor chip.

Additionally, in this example, the clamp voltage Vclamp and the reference voltage Vref of M level are applied to the back gate (substrate). The voltage of M level, which is applied to the back gate, is less susceptible to the effect of coupling to the source, than the voltage of M level that is applied to the gate. Thus, as regards the voltage of M level which is applied to the back gate, there is no need to consider the problem of a potential variation.

FIG. 9 is a graph illustrating the relationship between the clamp voltage Vclamp and read current Iread, and the relationship between the reference voltage Vref and reference current Iref, in the semiconductor memory device according to the first embodiment.

As illustrated in FIG. 9, while the clamp voltage Vclamp of the back gate of the clamp transistor M32 that is the nMOS transistor varies from 0 V to −0.5 V, the read current Iread varies by about 10 to 20%. Similarly, while the reference voltage Vref of the back gate of the reference transistor M34 that is the nMOS transistor varies from 0 V to −0.5 V, the reference current Iref varies by about 10 to 20%.

On the other hand, in the operational temperature range stipulated by normal SPEC, the read current Iread and reference current Iref vary by about 10 to 20%.

Specifically, by the clamp voltage Vclamp and reference voltage Vref being applied to the back gates of the clamp transistor M32 and reference transistor M34 which are nMOS transistors, the variations of the read current Iread and reference current Iref due to the temperature characteristic variation of each element can sufficiently be compensated.

[Advantageous Effects in the First Embodiment]

In the MRAM, the memory cell array is electrically coupled to one input terminal of the sense amplifier via the memory cell path, and the reference cell (reference signal generation circuit) is electrically coupled to the other input terminal via the reference path.

A read current of "1" data or "0" data of the memory cell occurs in the memory cell path at the time of read. On the other hand, for example, an intermediate current (reference current) between of "1" data and "0" data occurs in the reference path at the time of read. The data of the memory cell is read by comparing the read current of the memory path and the reference current of the reference path.

The clamp transistor is provided on the memory cell path. At the time of read, the clamp voltage Vclamp is applied to the gate of the clamp transistor. On the other hand, the reference transistor is provided on the reference path. At the time of read, the reference voltage Vref is applied to the gate of the reference transistor.

These clamp voltage Vclamp and reference voltage Vref are voltages (analog voltages) of M (Middle) level that is variable in accordance with temperatures. The clamp voltage Vclamp and reference voltage Vref are controlled at proper values so as to compensate the temperature characteristic variation of, for example, the resistance of the memory cell. Thereby, the currents flowing through the memory cell path and reference path are properly controlled in accordance with temperatures.

However, the clamp voltage Vclamp and reference voltage Vref of M level are more susceptible to the effect of the other potential lines than the power supply voltage VDD of H (High) level and the ground voltage VSS of L (Low) level. For example, when the clamp voltage Vclamp and reference voltage Vref are applied to the gates of the clamp transistor and reference transistor, these voltages are affected by the potential variation due to the charge/discharge of the memory cell path and reference path. To be more specific, by being affected by the coupling due to the gate capacitor (the capacitor of the gate and source) of the clamp transistor and reference transistor, the clamp voltage Vclamp and reference voltage Vref, which are applied to the gates, sharply vary. In other words, potential variations occur at the gates of the clamp transistor and reference transistor.

At this time of potential variation, the read current of the memory cell path and the reference current of the reference path vary. Thereby, since the reference current deviates from the optimal point (the intermediate value between "1" data and "0" data), the read margin becomes small, and the possibility of erroneous sense (read) increases. If the read operation is executed after the potential variation has decreased, the erroneous read can be suppressed. However, the read operation speed lowers due to the wait until the variation has decreased.

By contrast, according to the first embodiment, in the read operation, the power supply voltage VDD is applied to the gates of the clamp transistor M32 and reference transistor M34. The power supply voltage VDD is hardly affected by other potential lines, and does not easily vary. It is thus possible to suppress the potential variations of the clamp transistor M32 and reference transistor M34. Therefore, there is no need to wait until the potential variation is stabilized, and it is possible to increase the read operation speed.

Meanwhile, when the power supply voltage VDD is applied to the gates of the clamp transistor M32 and reference transistor M34, the gate potential is fixed since the power supply voltage VDD is the fixed voltage. In this case, it is not possible to compensate the temperature characteristic variation of, e.g. the resistance of the memory cell MC, and the read current Iread and reference current Iref due to this.

For example, the resistance of the memory cell MC varies due to the temperature variation and the read current Iread varies, and consequently the reference current Iref deviates from the optimal point (the intermediate value between "1" data and "0" data). As a result, the read margin decreases, and the possibility of erroneous sense (read) increases. Besides, if the threshold voltage of the clamp transistor M32 lowers due to the temperature variation, the read current Iread of the memory cell path increases. As a result, read disturb of the memory cell MC occurs.

By contrast, in the first embodiment, the reference voltage Vref of M level, which is variable in accordance with temperatures, is applied to the back gate of the reference transistor M34. The reference voltage Vref is controlled at a proper value so as to compensate the temperature characteristic variation of the resistance of the memory cell MC. Thereby, the reference current Iref can be controlled at the optimal point, and the read margin can be increased regardless of the temperature.

In addition, in the first embodiment, the clamp voltage Vclamp of M level, which is variable in accordance with temperatures, is applied to the back gate of the clamp transistor M32. The clamp voltage Vclamp is controlled at a proper value so as to compensate the temperature characteristic variation of the threshold Vtha of the clamp transistor M32. To be more specific, when the temperature rises and the threshold Vtha falls, a negative clamp voltage Vclamp is applied. Thereby, the threshold voltage Vtha, which has fallen due to the rise in temperature can be raised in a pseudo-manner by the clamp voltage Vclamp, and can be compensated. Therefore, it is possible to suppress an increase of the read current Iread of the memory cell path, and to suppress read disturb.

In the meantime, although the example has been illustrated in which the voltage that is variable in accordance with temperatures is applied to each of the back gates of the clamp transistor M32 and reference transistor M34, there is no restriction to this example. The voltage that is variable in accordance with temperatures may be applied to one of the back gates of the clamp transistor M32 and reference transistor M34, and a fixed voltage (e.g. ground voltage VSS) may be applied to the other.

<Second Embodiment>

Hereinafter, referring to FIG. 10 and FIG. 11, a semiconductor memory device according to a second embodiment is described. In the second embodiment, depletion-type (hereinafter "D-type") nMOS transistors are used as the clamp transistor M32 and reference transistor M34. In addition, a ground voltage VSS is applied to the gates thereof. Besides, a reference voltage Vref of M level, which is variable in accordance with temperatures, is applied to the back gate of the reference transistor M34. Thereby, the same advantageous effects as in the first embodiment can be obtained.

The second embodiment will be described below in detail. Incidentally, in the second embodiment, the description of the same points as in the first embodiment is omitted, and different points will mainly be described.

[Configuration Example in the Second Embodiment]

To begin with, referring to FIG. 10, a description is given of a configuration example of the semiconductor memory device according to the second embodiment.

FIG. 10 is a circuit diagram illustrating a configuration example in the semiconductor memory device according to the second embodiment.

As illustrated in FIG. 10, the second embodiment differs from the first embodiment in that the clamp transistor M32 and reference transistor M34 are D-type nMOS transistors. Specifically, the threshold voltages of the clamp transistor M32 and reference transistor M34 are negative.

The power supply voltage VDD or ground voltage VSS is supplied by the clamp gate/reference gate control circuit 14 to the gates of the clamp transistor M32 and reference transistor M34 which are D-type nMOS transistors. The clamp voltage Vclamp is supplied by the clamp P-well potential control circuit 15 to the back gate (substrate) of the clamp transistor M32. The reference voltage Vref is supplied by the reference P-well potential control circuit 16 to the reference transistor M34. The clamp voltage Vclamp and reference voltage Vref are negative voltages (e.g. about 0~−0.5 V) of M level which is variable in accordance with temperatures.

In the meantime, as will be described later, in the second embodiment, the ground voltage VSS is applied to the clamp transistor M32 and reference transistor M34 in the read operation. In addition, the ground voltage VSS may be applied to the gates of the clamp transistor M32 and reference transistor M34, not only when the read operation is executed, but at all times. Thus, in the second embodiment, the ground voltage VSS may be electrically coupled directly to the gates of the clamp transistor M32 and reference transistor M34, without intervention of the transistors as the clamp gate/reference gate control circuit 14.

[Example of Read Operation]

Figure 11:
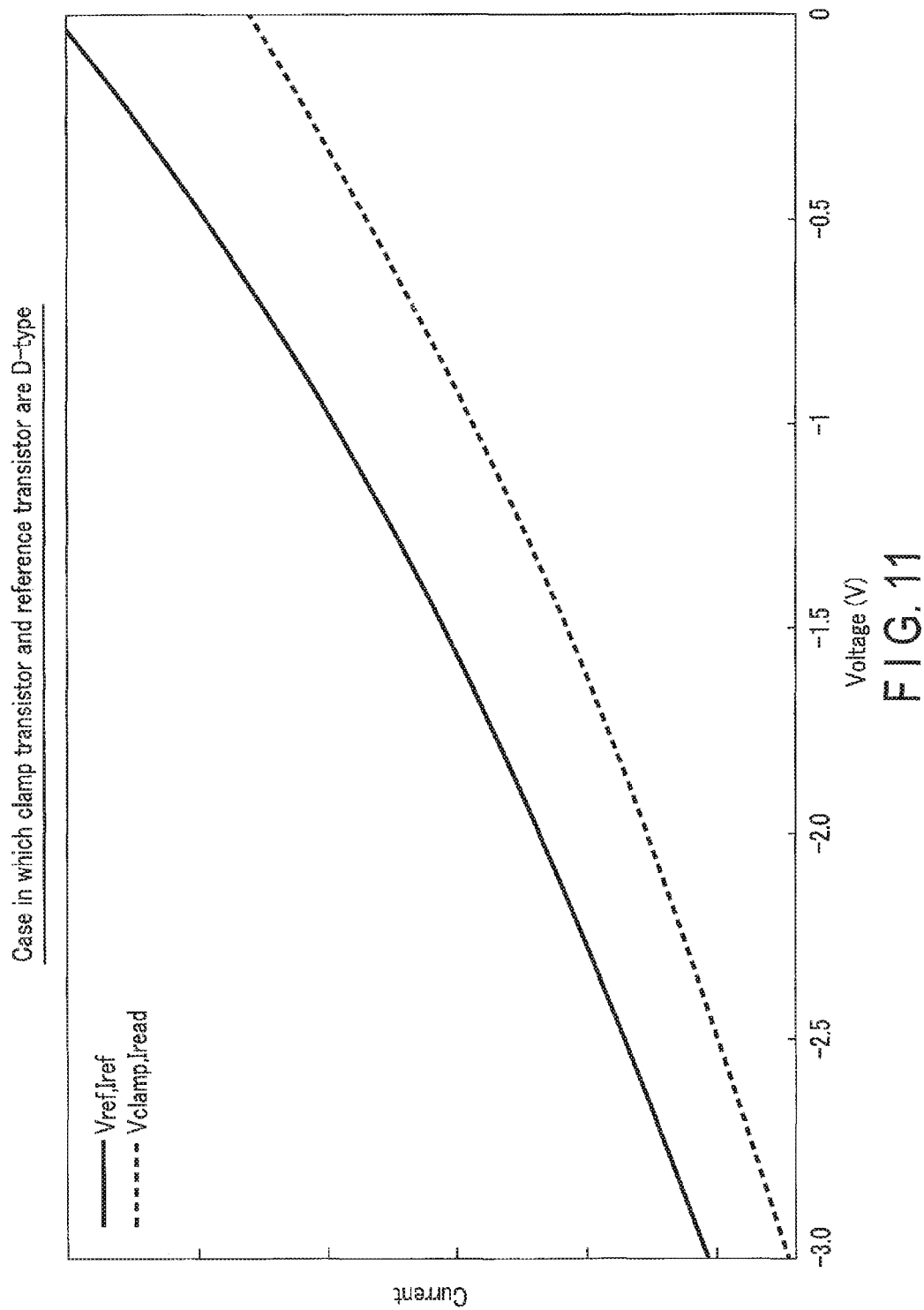
FIG. 11 is a graph illustrating a relationship between a clamp voltage and a read current, and a relationship between a reference voltage and a reference current, in the semiconductor memory device in the second embodiment.

Next, referring to FIG. 10 and FIG. 11, an example of the read operation in the second embodiment is described.

As illustrated in FIG. 10, in the reference path at the time of the read operation, the read enable signal REN of H level is supplied to the gate of the read enable transistor M33, and the ground voltage VSS is supplied to the gate of the reference transistor M34. Here, since the reference transistor M34 is the D-type transistor, the threshold voltage Vthb of the reference transistor M34 is a negative voltage. Thereby, the read enable transistor M33 and reference transistor M34 enter the ON state, and a voltage "VSS−Vthb" is transferred to the other end side (reference signal generation circuit 13 side) of the reference transistor M34. As a result, in accordance with the voltage "VSS-Vthb" that is transferred, a reference current Iref flows through the reference path.

At this time, for example, in a case of high temperatures, the resistance of the memory cell MC with "0" data (in the low resistance state) does not vary, and the resistance of the memory cell MC with "1" data (in the high resistance state) decreases. Thus, an intermediate value between the "1" data and "0" data decreases. Accordingly, the reference current Iref of the reference path becomes greater (closer to the value of "1" data) than an optimal point (intermediate value between "1" data and "0" data). As a result, the read margin becomes smaller, and the possibility of erroneous sense (read) increases.

In the second embodiment, the reference voltage Vref is applied as the back gate bias Vsub of the reference transistor M34. As described above, the reference voltage Vref is a negative voltage of M level which is variable in accordance with temperatures. By applying the reference voltage Vref that is the negative voltage to the back gate of the reference transistor M34, the threshold voltage Vthb of the reference transistor M34 can be increased in a pseudo-manner. As a result, the transferred voltage [VSS−vthb] becomes smaller than in the case in which the reference voltage Vref is not applied. Thus, the reference current Iref of the reference path can be decreased, and a deviation of the optimal point due to a temperature variation can be compensated. Accordingly, the read margin can be increased, and erroneous read can be suppressed.

On the other hand, as illustrated in FIG. 10, in the memory cell path at the time of the read operation, the read enable signal REN of H level is supplied to the gate of the read enable transistor M31, and the ground voltage VSS is supplied to the gate of the clamp transistor M32. Here, since the clamp transistor M32 is the D-type transistor, the threshold voltage Vtha of the clamp transistor M32 is a negative voltage. Thereby, the read enable transistor M31 and clamp transistor M32 enter the ON state, and a voltage [VSS−Vtha] is transferred to the other end side (memory cell array 11 side) of the clamp transistor M32. As a result, in accordance with the transferred voltage [VDD−Vtha], a read current Iread (parallel current Ip or antiparallel current Iap) flows through the memory cell path.

At this time, for example, in the case of high temperatures, the threshold voltage Vtha of the clamp transistor M32 decreases. Thus, the transferred voltage [VSS−Vtha] increases (read current Iread increases). As a result, read disturb occurs.

In the second embodiment, the clamp voltage Vclamp is applied as the back gate bias Vsub of the clamp transistor M32. As described above, the clamp voltage Vclamp is a negative voltage of M level which is variable. By applying the clamp voltage Vclamp that is the negative voltage to the back gate of the clamp transistor M32, the threshold voltage Vtha of the clamp transistor M32 can be increased in a pseudo-manner. As a result, the transferred voltage [VSS−Vtha] becomes smaller than in the case in which the clamp voltage Vclamp is not applied. Thus, even if the threshold voltage Vtha decreases due to high temperatures, this can be compensated by the negative clamp voltage Vclamp. Specifically, even at high temperatures, it is possible to suppress an increase of the transferred voltage [VSS−Vtha] (read current Iread), and to suppress read disturb of the memory cell.

FIG. 10 is a graph illustrating the relationship between the clamp voltage Vclamp and read current Iread, and the relationship between the reference voltage Vref and reference current Iref in the semiconductor memory device in the second embodiment.

As illustrated in FIG. 11, while the clamp voltage Vclamp of the back gate of the clamp transistor M32 that is the D-type nMOS transistor varies from 0 V to −0.5 V, the read current Iread varies by about 10 to 20%. Similarly, while the reference voltage Vref of the back gate of the reference transistor M34 that is the D-type nMOS transistor varies from 0 V to −0.5 V, the reference current Iref varies by about 10 to 20%.

On the other hand, in the operational temperature range stipulated by normal SPEC, the read current Iread and reference current Iref vary by about 10 to 20%.

Specifically, by the clamp voltage Vclamp and reference voltage Vref being applied to the back gates of the clamp transistor M32 and reference transistor M34 which are D-type nMOS transistors, the variations of the read current Iread and reference current Iref due to the temperature characteristic variation of each element can sufficiently be compensated.

[Advantageous Effects in the Second Embodiment]

According to the second embodiment, the D-type nMOS transistors are used as the clamp transistor M32 and reference transistor M34. In addition, the ground voltage VSS is applied to the gates thereof. The ground voltage VSS is hardly affected by other potential lines, and does not easily vary. It is thus possible to suppress the potential variations of the clamp transistor M32 and reference transistor M34. Therefore, there is no need to wait until the potential variation is stabilized, and it is possible to increase the read operation speed.

Meanwhile, when the ground voltage VSS is applied to the gates of the clamp transistor M32 and reference transistor M34, the gate potential is fixed since the ground voltage VSS is the fixed voltage. In this case, it is not possible to compensate the temperature characteristic variation of the resistance of the memory cell MC and the threshold voltage Vtha of the clamp transistor M32, and the read current Iread and reference current Iref due to this.

By contrast, in the second embodiment, like the first embodiment, the reference voltage Vref of M level, which is variable in accordance with temperatures, is applied to the back gate of the reference transistor M34, and the clamp voltage Vclamp of M level, which is variable in accordance with temperatures, is applied to the back gate of the clamp transistor M32. Thereby, the same advantageous effects as in the first embodiment can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell which includes a variable resistance element;
a reference signal generation circuit configured to generate a reference signal;
a sense amplifier including a first input terminal and a second input terminal;
a first transistor configured to electrically couple the memory cell and the first input terminal of the sense amplifier;
a second transistor configured to electrically couple the reference signal generation circuit and the second input terminal of the sense amplifier;
a first control circuit configured to supply a voltage to gates of the first transistor and the second transistor;
a second control circuit configured to supply a first voltage except 0V to a back gate of the first transistor;
a third control circuit configured to supply a second voltage except 0V to a back gate of the second transistor; and
a functional circuit including a third transistor,
wherein threshold voltages of the first transistor and the second transistor are greater than a threshold voltage of the third transistor.

2. The device of claim 1, wherein the second control circuit is configured to supply the first voltage such that the first voltage has temperature dependency and/or the third control circuit is configured to supply the second voltage such that the second voltage has temperature dependency.

3. The device of claim 1, wherein the second control circuit is configured to supply the first voltage such that the first voltage is a negative voltage and/or the third control circuit is configured to supply the second voltage such that the second voltage is a negative voltage.

4. The device of claim 1, wherein during a read operation, the second control circuit supplies the first voltage and/or the third control circuit supplies the second voltage.

5. The device of claim 1, wherein:
the first transistor and the second transistor have positive threshold voltages, and
during a read operation, the first control circuit supplies a power supply voltage to the gates of the first transistor and the second transistor.

6. A semiconductor memory device comprising:
a memory cell which includes a variable resistance element;
a reference signal generation circuit configured to generate a reference signal;
a sense amplifier including a first input terminal and a second input terminal;
a first transistor configured to electrically couple the memory cell and the first input terminal of the sense amplifier;
a second transistor configured to electrically couple the reference signal generation circuit and the second input terminal of the sense amplifier;
a first control circuit configured to supply a voltage to gates of the first transistor and the second transistor;
a second control circuit configured to supply a first voltage except 0V to a back gate of the first transistor; and a third control circuit configured to supply a second voltage except 0V to a back gate of the second transistor, wherein:

the first transistor and the second transistor have negative threshold voltages, and during a read operation, the first control circuit supplies a ground voltage to the gates of the first transistor and the second transistor.

7. A semiconductor memory device comprising:

a memory cell which includes a variable resistance element;

a reference signal generation circuit configured to generate a reference signal;

a sense amplifier including a first input terminal and a second input terminal;

a first transistor configured to electrically couple the reference signal generation circuit and the first input terminal of the sense amplifier;

a first control circuit configured to supply a voltage to a gate of the first transistor; and a second control circuit configured to supply a first voltage except 0V to a back gate of the first transistor, wherein the second control circuit comprises:

a first operational amplifier configured to compare a second voltage which has temperature dependency and a third voltage based on the first voltage, and configured to output a fourth voltage based on a result of the comparison;

a negative voltage generation pump configured to operate in accordance with the fourth voltage;

a second operational amplifier configured to compare the second voltage and a fifth voltage based on the first voltage, and to output a sixth voltage based on a result of the comparison; and a third transistor having a gate supplied with the sixth voltage.

8. The device of claim 7, wherein the second control circuit is configured to supply the first voltage such that the first voltage has temperature dependency.

9. The device of claim 7, wherein:

the first transistor has positive threshold voltage, and during a read operation, the first control circuit supplies a power supply voltage to the gate of the first transistor.

10. The device of claim 7, further comprising a second transistor configured to electrically couple the memory cell and the second input terminal of the sense amplifier, wherein in a read operation, a fixed voltage is supplied to a back gate of the second transistor.

* * * * *